(12) United States Patent
Kamp et al.

(10) Patent No.: US 12,051,770 B2
(45) Date of Patent: Jul. 30, 2024

(54) INTEGRATION OF SECONDARY OPTICS INTO CHIP COVERS FOR IMPROVED OPTICAL EMISSION OF HIGH INTENSITY LIGHT-EMITTING DIODES

(71) Applicant: CreeLED, Inc., Durham, NC (US)

(72) Inventors: Eric Kamp, Durham, NC (US); Derek Miller, Columbus, OH (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 17/946,226

(22) Filed: Sep. 16, 2022

(65) Prior Publication Data

US 2023/0120890 A1 Apr. 20, 2023

Related U.S. Application Data

(60) Provisional application No. 63/256,077, filed on Oct. 15, 2021.

(51) Int. Cl.
*H01L 33/58* (2010.01)
*G02B 1/00* (2006.01)
*G02B 5/30* (2006.01)
*H01L 33/50* (2010.01)

(52) U.S. Cl.
CPC .............. *H01L 33/58* (2013.01); *G02B 1/002* (2013.01); *G02B 5/3016* (2013.01); *H01L 33/50* (2013.01)

(58) Field of Classification Search
CPC ......... H01L 33/58; H01L 33/44; H01L 33/50; H01L 33/54; G02B 1/002; G02B 5/3016
See application file for complete search history.

(56) References Cited

U.S. PATENT DOCUMENTS

2019/0326484 A1 10/2019 Welch et al.
2022/0146079 A1* 5/2022 Tamma .............. G02B 27/0172

OTHER PUBLICATIONS

Author Unknown, "Geometric Phase Lens, " imagineoptix.com/technology/geometric-phase-lens, retrieved from The Wayback Machine, Nov. 11, 2020, ImagineOptix, 3 pages.

(Continued)

*Primary Examiner* — Anne M Hines
*Assistant Examiner* — Jose M Diaz
(74) *Attorney, Agent, or Firm* — Withrow & Terranova, P.L.L.C.

(57) ABSTRACT

Solid-state lighting devices including light-emitting diodes (LEDs), and more particularly integrated secondary optics into LED chip cover structures for improved optical emission of high intensity LEDs is disclosed. Optical elements are integrated as a secondary optic onto one or both surfaces of a chip cover structure, where the chip cover structure may be referred to as a primary optic. The integrated secondary optic may be formed directly on one or both surfaces of the chip cover structure. The integrated secondary optic is purposely built to be coupled with the light emission of the LED to emit a desired emission profile. In this regard, a final luminaire may be provided with increased efficiency either by improving the coupling of the LED into a conventional secondary optic or in some cases by removing the need for a conventional secondary optic all together.

20 Claims, 8 Drawing Sheets

(56) References Cited

OTHER PUBLICATIONS

Author Unknown, "Optics Technology Overview," imagineoptix.com/technology, retrieved from The Wayback Machine, Feb. 27, 2021, ImagineOptix, 4 pages.

Author Unknown, "Polarization Conversion System," imagineoptix.com/technology/polarization-conversion-system, retrieved from The Wayback Machine, Jun. 14, 2021, ImagineOptix, 5 pages.

Burrows, "Single metalens focuses all colors of the rainbow in one point," The Harvard Gazette, Jan. 2018, 3 pages.

Chen, "Dual-polarity plasmonic metalens for visible light," Nature Communications, Nov. 2012, Macmillan Publishers Limited, 5 pages.

Khorasaninejad, et al., "Metalenses at visible wavelengths: Diffraction-limited focusing and subwavelength resolution imaging," Science, vol. 352, Issue 6290, Jun. 2016, pp. 1190-1195.

Liu, et al., "Metasurface Enabled Wide-Angle Fourier Lens," Advanced Materials, Apr. 2018, 8 pages.

Moon, et al., "Recent Progress on Ultrathin Metalenses for Flat Optics," iScience, vol. 23, Issue 12, Dec. 18, 2020, 21 pages.

U.S. Appl. No. 17/514,012, filed Oct. 29, 2021.

\* cited by examiner

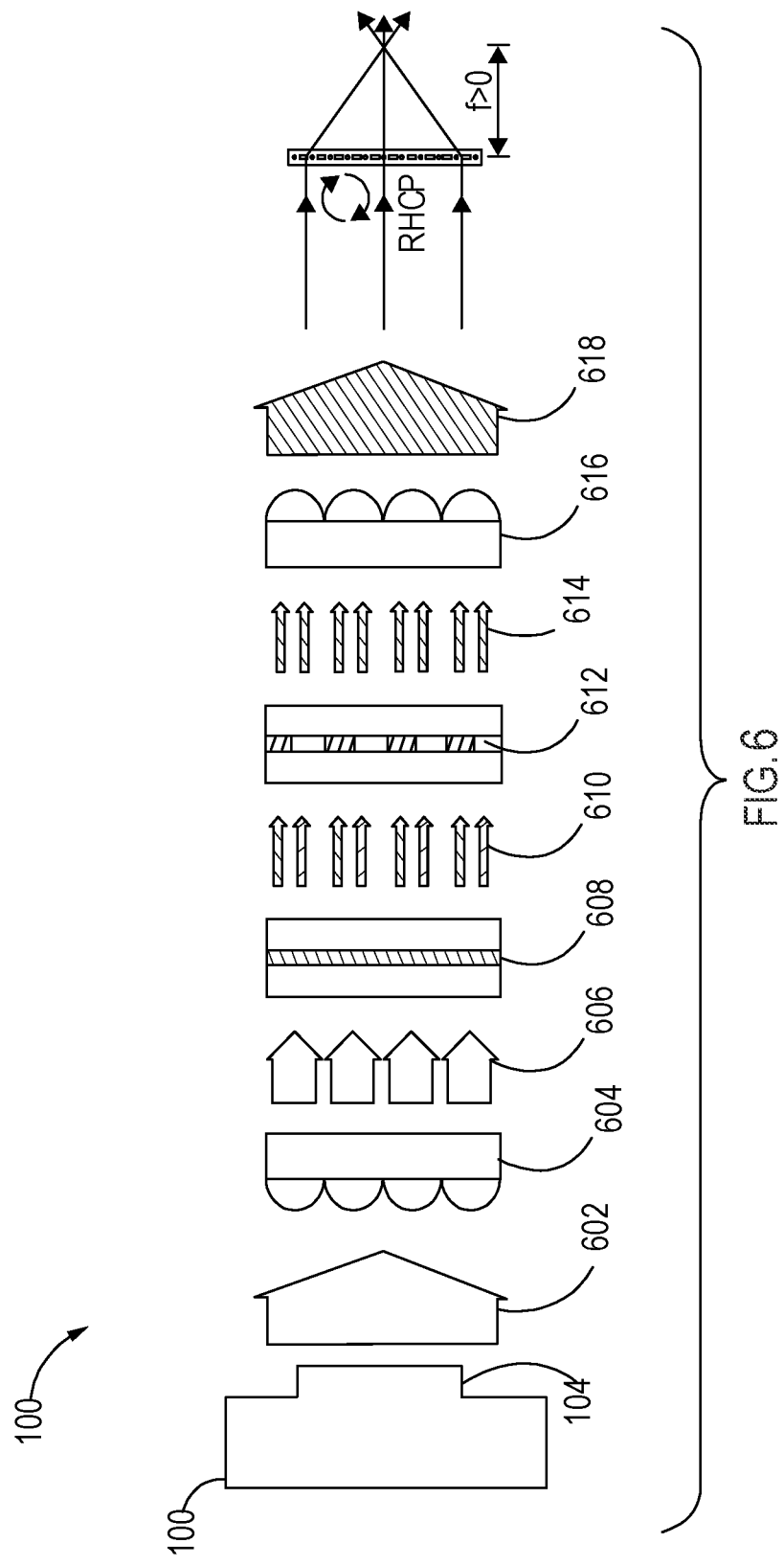

INTEGRATION OF SECONDARY OPTICS INTO CHIP COVERS FOR IMPROVED OPTICAL EMISSION OF HIGH INTENSITY LIGHT-EMITTING DIODES

RELATED APPLICATION

This application is a non-provisional conversion of, and claims the benefit of priority to U.S. Provisional Application Ser. No. 63/256,077, filed on Oct. 15, 2021, entitled "INTEGRATION OF SECONDARY OPTICS INTO CHIP COVERS FOR IMPROVED OPTICAL EMISSION OF HIGH INTENSITY LIGHT-EMITTING DIODES", the disclosure of which is incorporated by reference in its entirety herein.

FIELD OF THE DISCLOSURE

The present disclosure relates to solid-state lighting devices including light-emitting diodes (LEDs), and more particularly to the integration of secondary optics into LED chip cover structures for improved optical emission of high intensity LEDs.

BACKGROUND

Chip covers are used in light-emitting diodes (LEDs) which requires tight control of the LED emission area. Optical emission properties of chip covers, e.g., beam angle, color over angle, emission pattern, and emission axis in existing chip covers, are primarily determined by the material used in the lens. In application, LEDs are typically coupled into a secondary optic to achieve the directionality or emission pattern for the final luminaire. This results in several inefficiencies, such as light loss due to imperfect coupling to the secondary optic and large luminaire designs in both the LED (with a heatsink) and secondary optic.

SUMMARY

Embodiments of the present disclosure solve this problem by integrating secondary optics into chip cover structures or a surface of a Light Emitting Diode (LED). In order to accomplish this, an optical element is integrated as a secondary optic onto one or both surfaces of a chip cover structure, where the chip cover structure may be referred to as a primary optic. The integrated secondary optic may be formed directly on one or both surfaces of the chip cover structure. The integrated secondary optic is purposely built to be coupled with the light emission of the LED to emit the desired optical profile. With this design, a final luminaire can be made more efficient either by improving the coupling of the LED into a conventional secondary optic or in some cases by removing the need for a conventional secondary optic all together.

In an embodiment of the present disclosure, an LED package is provided, the LED package comprising an LED chip and a cover structure arranged over the LED chip, wherein the cover structure comprises an integrated secondary optic that is arranged to alter an emission profile of light exiting the LED package.

In another embodiment of the present disclosure, an LED cover structure that covers an LED chip is provided. The LED cover structure can comprise a superstrate layer and a flat optic layer that is arranged to alter an emission profile of light exiting an LED package comprised of the LED chip and the LED cover structure.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 6 illustrates using a liquid crystal geometric phase lens integrated into a glass chip cover in order to focus LED emissions according to some embodiments of the present disclosure.

DETAILED DESCRIPTION

Figure 1A:
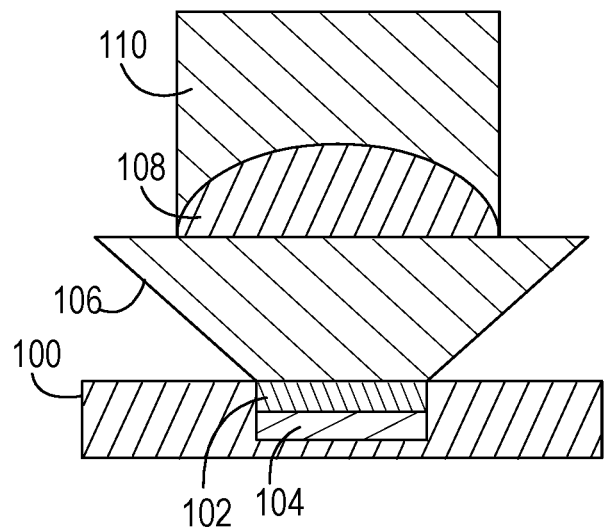
FIGS. 1A and 1B depict cross-sectional views of a light-emitting diode (LED) package with an LED chip and a chip cover and illustrating incomplete capture of LED package emissions by a conventional secondary optic for narrow emission beam and directional emission beam applications according to some embodiments of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Before delving into specific details of various aspects of the present disclosure, an overview of various elements that may be included in exemplary light-emitting diode (LED) packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of from 2500 Kelvin (K) to 10,000K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{1-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, one or more surfaces of LED chips may be conformally coated with one or more lumiphoric materials, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element. Wavelength conversion elements may include a support element, such as a superstrate, and one or more lumiphoric materials that are provided by any suitable means, such as by coating a surface of the superstrate or by incorporating within the superstrate. The term "superstrate" as used herein refers to an element placed on or over an LED chip that may include a lumiphoric material. The term "superstrate" is used herein, in part, to avoid confusion with other substrates that may be part of the semiconductor light-emitting device, such as a growth or carrier substrate of the LED chip or a submount of an LED package. The term "superstrate" is not intended to limit the orientation, location, and/or composition of the structure it describes. In some embodiments, the superstrate may be composed of a transparent material, a semi-transparent material, or a light-transmissive material, such as sapphire, SiC, silicone, and/or glass (e.g., borosilicate and/or fused quartz), where the transparency, semi-transparency, and/or transmissivity is relative to light from an LED chip and/or a lumiphoric material. Superstrates may be patterned to enhance light extraction. Superstrates may be formed from a bulk substrate which is optionally patterned and then singulated. In certain embodiments, the patterning of a superstrate may be performed by an etching process (e.g., wet or dry etching). In certain embodiments, the patterning of a superstrate may be performed by otherwise altering the surface, such as by a laser or saw. In certain embodiments, the superstrate may be thinned before or after the patterning process is performed. In certain embodiments, superstrates may comprise a generally planar upper surface that corresponds to a light emission area of the LED package.

One or more lumiphoric materials may be arranged on the superstrate by, for example, spraying and/or otherwise coating the superstrate with the lumiphoric materials. Wavelength conversion elements may be attached to one or more LED chips using, for example, a layer of transparent adhesive. In certain embodiments, the layer of the transparent adhesive may include silicone with a refractive index in a range of about 1.3 to about 1.6 that is less than a refractive index of the LED chip on which the wavelength conversion element is placed. In other embodiments, wavelength conversion elements may comprise alternative configurations, such as phosphor-in-glass or ceramic phosphor plate arrangements. Phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In other embodiments, an active LED structure may be bonded to a carrier submount, and the growth substrate may be removed such that light may exit the active LED structure without passing through the growth substrate.

According to aspects of the present disclosure LED packages may include one or more elements, such as lumiphoric materials, encapsulants, light-altering materials, lens, and electrical contacts, among others, that are provided with one or more LED chips. In certain aspects, an LED package may include a support member, such as a submount or a leadframe. Light-altering materials may be arranged within LED packages to reflect or otherwise redirect light from the one or more LED chips in a desired emission direction or pattern. Submounts of LED packages may be formed of many different materials with a preferred material being electrically insulating. Suitable materials include, but are not limited to ceramic materials such as aluminum oxide or alumina, aluminum nitride, or organic insulators like polyimide (PI) and polyphthalamide (PPA). In other embodiments submounts may refer to a printed circuit board (PCB), sapphire, silicon or any other suitable material. For PCB embodiments different PCB types can be used such as standard FR-4 PCB, metal core PCB, or any other type of PCB. LED packages according to the present disclosure can be fabricated using a method that utilizes a submount panel sized to accommodate a plurality of submounts. Multiple LED packages can be formed on the panel, with individual packages being singulated from the panel. LED chips may be mounted to submounts using various methods and material mounting such as using conventional solder materials that may or may not contain a flux material or dispensed polymeric materials that may be thermally and electrically conductive, as well as other methods and material mounting such as solderless, direct attach, or other conventional attachment means.

As used herein, light-altering materials for LED packages may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index or refraction that is configured to refract light emissions in a desired direction. In certain aspects light-reflective particles may also be referred to as light-scattering particles. A weight ratio of the light-reflective particles or scattering particles to a binder may comprise a range of about 1:1 to about 2:1. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast. In certain embodiments, the light-altering material includes both light-reflective material and light-absorbing material suspended in a binder.

Figure 1B:
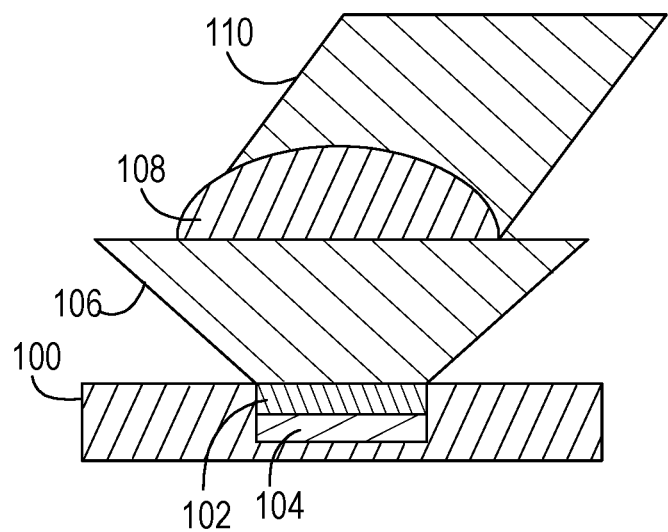

Chip covers, which may also be referred to as chip cover structures, are used in LEDs which requires tight control of the LED emission area. Optical emission properties of chip covers, i.e., beam angle, color over angle, emission pattern, and emission axis in existing chip covers, are primarily determined by the material used in the lens. In application, LEDs or LED packages are typically coupled into a secondary optic to achieve the directionality or emission pattern for the final luminaire. This results in several inefficiencies, such as light loss due to imperfect coupling to the secondary optic and large luminaire designs in both the LED (with a heatsink) and secondary optic. FIGS. 1A and 1B illustrates such inefficiencies in optical coupling, where emissions 106 from an LED package 100 comprising an LED chip 104 and/or a chip cover 102 may have an emission profile that does not entirely align with a conventional secondary optic 108. For example, LED package emissions may have larger dimensions (wider in both FIGS. 1A and 1B) than a light receiving surface or area of a conventional secondary optic, resulting in incomplete capture of LED package emissions by the conventional secondary optic, and a post-secondary optic emission 110 that is less intense than the initial emission 106. FIGS. 1A and 1B illustrate such arrangements for narrow emission beam (FIG. 1A) and directional emission beam applications (FIG. 1B).

Embodiments of the present disclosure solve this problem by integrating secondary optics into the chip covers or chip cover structures or onto the surface of the LED itself. In order to accomplish this, an optical element is integrated as a secondary optic onto one or both surfaces of a chip cover structure, where the chip cover structure may be referred to as a primary optic. The integrated secondary optic may be formed directly on one or both surfaces of the chip cover structure. In other embodiments, the integrated secondary optics can be placed on a surface of the LED diode. In an embodiment, the integrated secondary optic can be placed on an external sapphire layer of the flip-chip. In one or more embodiments, when integrated secondary optic is placed on a surface of the LED itself, the LED can be a monochromatic LED.

Figure 2A:
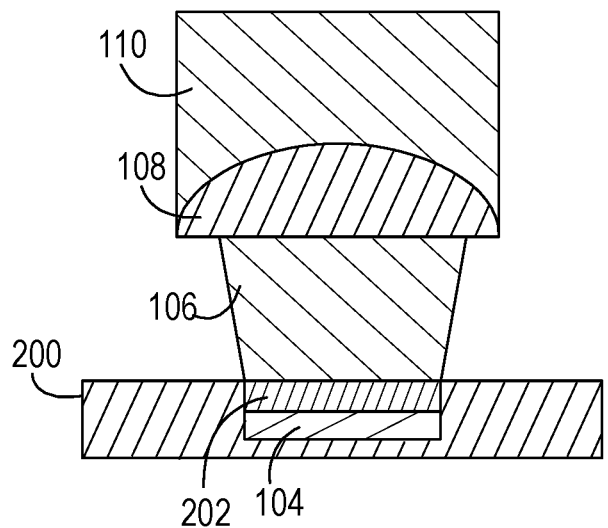
FIGS. 2A and 2B depict cross-sectional views of an LED package with an LED chip and a chip cover with an integrated secondary optic illustrating improved coupling to the conventional secondary optic for narrow emission beam applications and directional emission beam application without a conventional secondary optic according to some embodiments of the present disclosure.
Figure 2B:
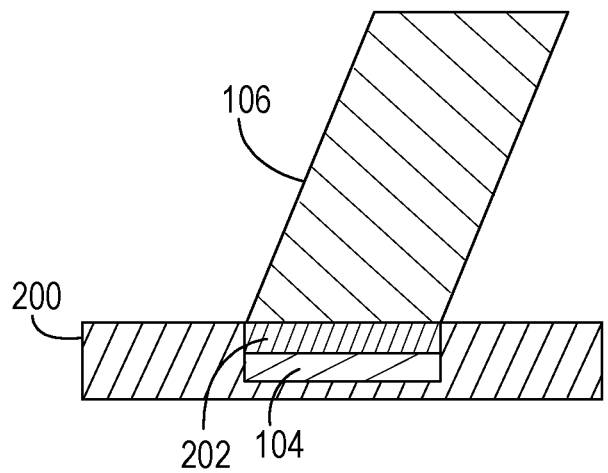

The integrated secondary optic is purposely built to be coupled with the light emission of the LED to emit the desired optical emission profile. With this design, a final luminaire can be made more efficient either by improving the coupling of the LED into a conventional secondary optic or in some cases by removing the need for a conventional secondary optic all together. FIGS. 2A and 2B illustrate such improvements in optical coupling that may be provided by the integrated secondary optic within the chip cover structure 202. For example, emissions from the LED package 200 can be tailored to certain dimensions, such as narrower emissions than what is shown in FIGS. 1A and 1B, that provide increased coupling of light to a conventional secondary optic 108, or even providing suitable shaping of light without the need for a conventional secondary optic. FIG. 2A illustrates such arrangements for narrow emission beam and FIG. 2B illustrates such an arrangement for directional emission beam applications, with and without the need for conventional secondary optics. While the conventional secondary optic is illustrated with the embodiment in FIG. 2A for a narrow beam that is not angled, the integrated secondary optic may be configured such that the conventional secondary optic may be omitted in certain embodiments.

In the example shown in FIG. 2A, the LED package emission 106, after being emitted by LED chip 104 and passing through the chip cover structure 202 with the integrated secondary optic is narrower than the shown in FIG. 1A, and the entire, or almost entire emission is incident with the conventional secondary optic 108, so that the resulting emission 110 is brighter than the emission 110 in FIG. 1A.

The optical emission properties for LEDs and LED packages with chip covers are typically determined by a variety of elements, including the LED chip, phosphor, and chip cover material choice. As a result, it is difficult to make large changes to the optical emission of these components. By integrating a secondary optic into the chip cover, larger changes can be made to the optical emission. The integrated secondary optic in the chip cover structure 202 can be a flat optic layer that is integrated directly onto one or both sides of the chip cover. The integrated secondary optic is purpose built in order to couple with the light emission of the LED to emit the desired optical profile.

Figure 3A:
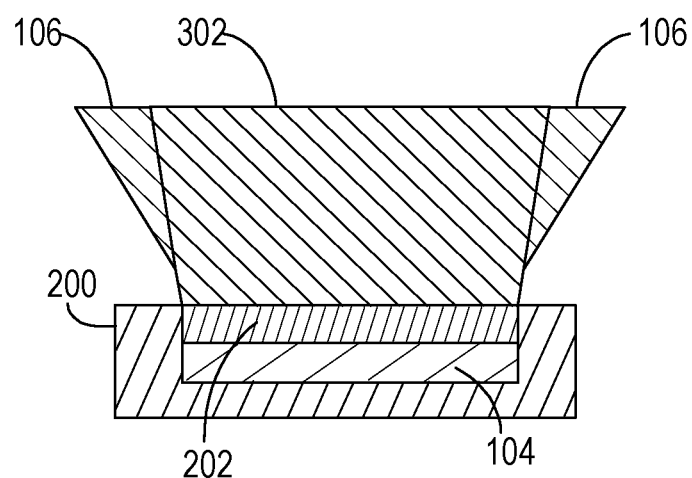
FIGS. 3A and 3B depict cross-sectional views of an LED chip with the secondary optic integrated into the chip cover in order to narrow the LED beam angle and an LED chip with the secondary optic integrated into the chip cover in order to redirect light away from 90° according to some embodiments of the present disclosure.

Examples of properties which may be altered by including an integrated secondary optic into the chip cover include beam angle, overall emission viewing angle, beam directionality or emission direction and color uniformity over angle. Beam angle is the angle at which light is emitted from an LED into the far field. As illustrated in FIG. 3A, by integrating a collimating lens on a surface of the chip cover 202 to form an integrated secondary optic, the beam angle may be reduced and possibly even fully collimated. This is shown where the beam angle of the light emission without the integrated secondary optic in the chip cover structure 202 is depicted as emission 106, whereas the light emission 302, which is representative of the emission with the integrated secondary optic in the chip cover structure 202 is narrower than light emission 106. The integrated secondary optic in the chip cover structure 202 can achieve partial, or even full collimation of the light emission 302. A fully collimated beam with no divergence, would not disperse with distance, except due to the effects of diffraction.

Figure 3B:
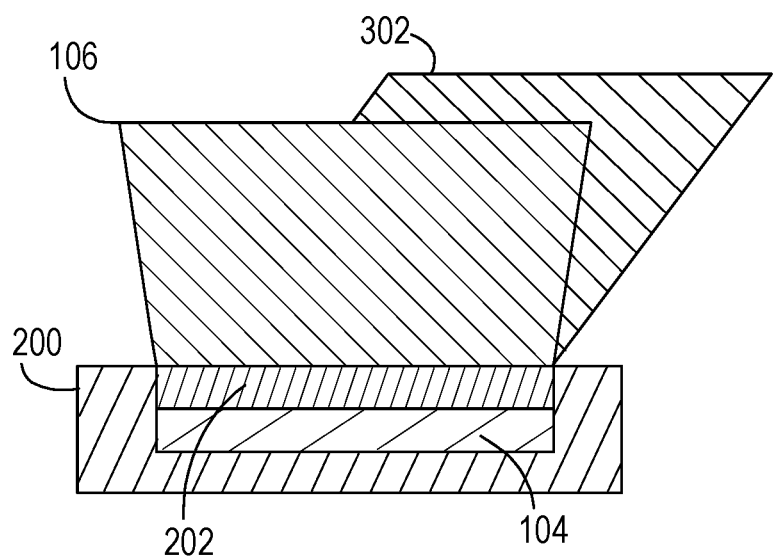

As illustrated in FIG. 3B, using a variation on a collimating lens, the integrated secondary optic could be configured such that the beam of the light emission 302 is redirected so that it emits at a certain angle away from 90 degrees with respect to the chip cover.

Figure 4A:
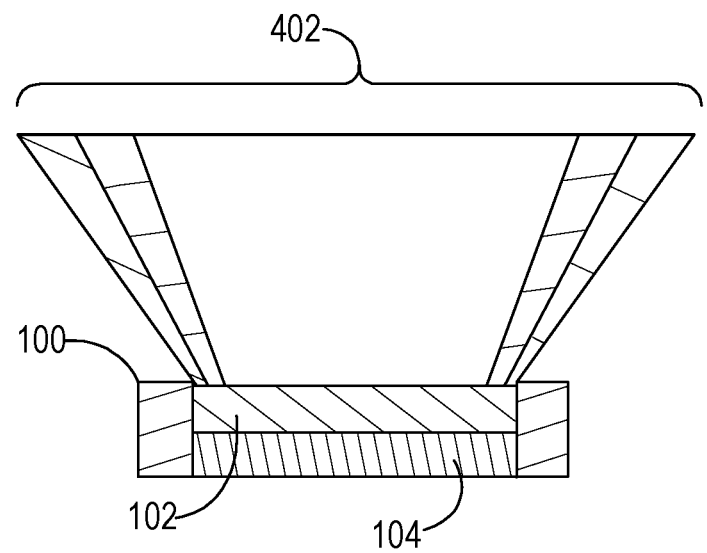
FIGS. 4A and 4B depict cross-sectional views of an LED chip with the secondary optic integrated into the chip cover with wavelength dependent focusing in order to improve the color over angle according to some embodiments of the present disclosure.
Figure 4B:
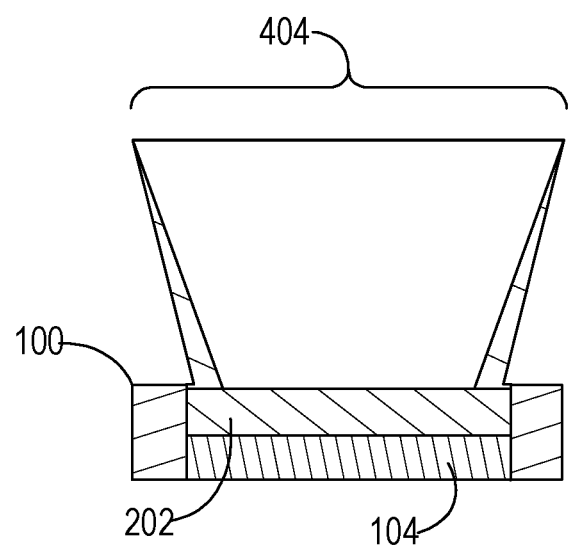

As illustrated in FIGS. 4A and 4B, configuring an integrated secondary optic using a lens which refracts light with a wavelength dependence, it may be possible to control the color over angle, particularly at wider emission angles away from 90 degrees with respect to the chip cover. For example, light from the LED chip 104 and light that is subject to wavelength conversion if lumiphoric materials are present in the chip cover can spread as in the light emission 402 with different beam widths or angles depending on the color or wavelength of the light. In FIG. 4B, an embodiment is depicted where the integrated secondary optic in the chip cover structure 202 can be fine-tuned such that the resulting light emission 404 is more uniformly mixed in the emission pattern. In another example, such a cover structure 202 with an integrated secondary optic may provide improved color over angle for embodiments where multiple LED chips with different emission wavelengths are arranged underneath the chip cover structure.

It is to be appreciated that while the embodiment in FIG. 4B depicts the integrated secondary optic in the chip cover structure 202 providing a more uniform emission pattern, in other embodiments, other emission patterns are possible, including less uniform emission patterns where the different wavelengths of light can have even greater beam angles. In some embodiments, the integrated secondary optic can be configured such that one or more wavelengths of light can be directed in a first direction, and other wavelengths of light can be directed in a second direction different than the first direction.

Figure 5A:
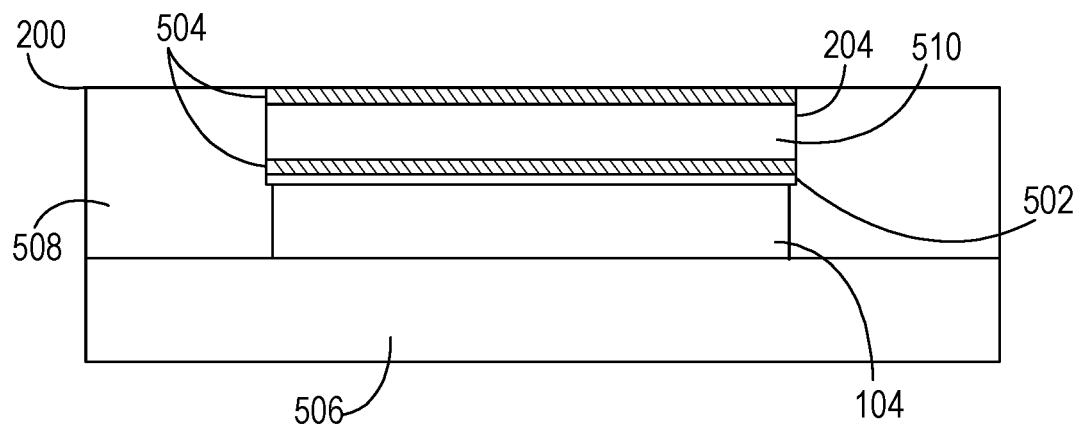
FIGS. 5A and 5B depict cross-sectional views of LED chips with flat optics integrated into chip covers according to some embodiments of the present disclosure.

In an embodiment, the integrated secondary optic can be a flat optic, or flat optical layer that is integrated directly onto one or both sides of the chip cover 202. This is depicted in FIGS. 5A and 5B which illustrate cross-sectional views of LED chips with one or more flat opticals 504 integrated into chip covers according to some embodiments of the present disclosure.

Secondary optics of the present disclosure can be integrated into a chip cover in several configurations. In an embodiment depicted in FIG. 5A, the LED chip 104 can be mounted on a substrate 506, and the chip cover 204 may be composed of a separate lumiphoric material layer 502 (e.g., phosphor) and a superstrate 510 (e.g., glass layers. In this embodiment, the integrated secondary optic 504 could be placed at either or both of the superstrate 510 interfaces normal to the propagation direction of light. That is, the integrated secondary optic 504 could be placed at either the interface between the superstrate 510 and the lumiphoric material layer 502 or could be placed at the interface between the superstrate 510 and the air or the light-exiting face of the LED package 200.

Figure 5B:
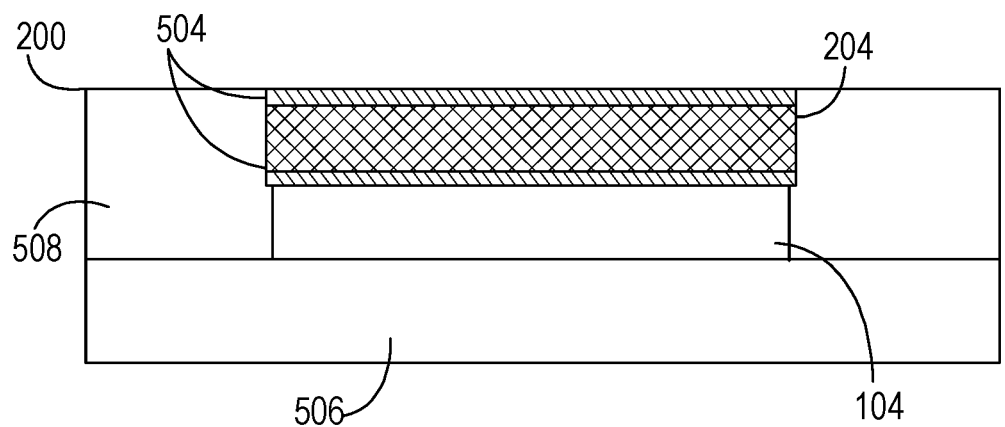

In another embodiment as illustrated FIG. 5B, the lumiphoric material (e.g., phosphor particles) can be integrated into the material of the chip cover structure 204, such as a phosphor-in-glass or a ceramic phosphor plate configuration. In this embodiment, the integrated secondary optics 504 could be integrated into either interface of the chip cover structure 204 normal to the propagation direction of light, or on the surface of the chip cover structure 204 facing the LED chip 104 or on the light exiting face of the chip cover structure 204. If the integrated secondary optics 504 are located on the surface of the chip cover structure 204 facing the LED chip 104, the lumiphoric material in the chip cover structure 204 can rescatter at least a portion of the light that was directed by the integrated secondary optics 504, but the integrated secondary optics 504 can still serve to collect more light from the LED chip 104 that would have otherwise scattered before reaching the chip cover structure 204. In at least some embodiments of the present disclosure, the integrated secondary optics 504 can also be integrated into the LED chip 104.

There are several types of flat optics that could be used as the integrated secondary optic in the chip cover. A first embodiment is shown in FIG. 6 where liquid crystal optics are integrated into a glass chip cover. Liquid crystals optics are made by applying a liquid crystal coating to a surface. By controlling the orientation of the polymers within the film during the film processing, the index of refraction is modified throughout the film so that the light can diffract transmitted light. The patterns can be controlled in order to create a lens that focuses the light. However, most liquid crystal lens focus a single polarization so a polarization converter can be included in the flat optic.

The polarization converter can work as described with reference to the following elements. The LED chip 104 can emit light 602 which can be unpolarized in one or more embodiments. The unpolarized light 602 can be incident on a microlens array 604 that collects light emitted by the LED chip 104 that is emitted in a wide range of directions, and collimates the light and separates the light into an array 606 of discrete unpolarized light spots. The array 606 of discrete unpolarized light spots can then be incident on a polarization grating 608 that splits each unpolarized light spot into two orthogonally polarized light spots 610.

The orthogonally polarized light spots 610 can then pass through a Louvered Multi-Twist Retarder (LoMTR) 612 that reverses the polarization of alternating spots 610 which results in an array 614 of spots of light that all have the same polarization. MTRs comprise two or more twisted liquid crystal (LC) layers on a single substrate and with a single alignment layer. Subsequent LC layers are aligned directly by prior layers, allowing simple fabrication, achieving automatic layer registration, and resulting in a monolithic film with a continuously varying optic axis.

The array of commonly polarized light 614 can then be incident on a second micro-lens array 616 that homogenizes the spots back into a single, now polarized, spot 618 with high color and brightness uniformity which can then be refracted and or focused by optical layer 620. The MLAs 604 and 616, polarization grating 608, and LoMTR 612 can collectively form the polarization converter.

Figure 7:
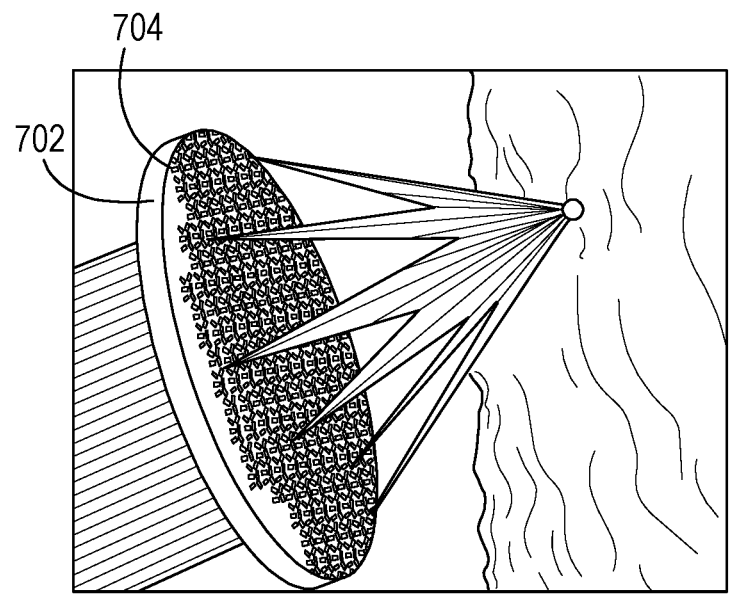
FIG. 7 illustrates a flat meta-lens created by patterning of metal features onto a glass structure according to some embodiments of the present disclosure.
Figure 8:
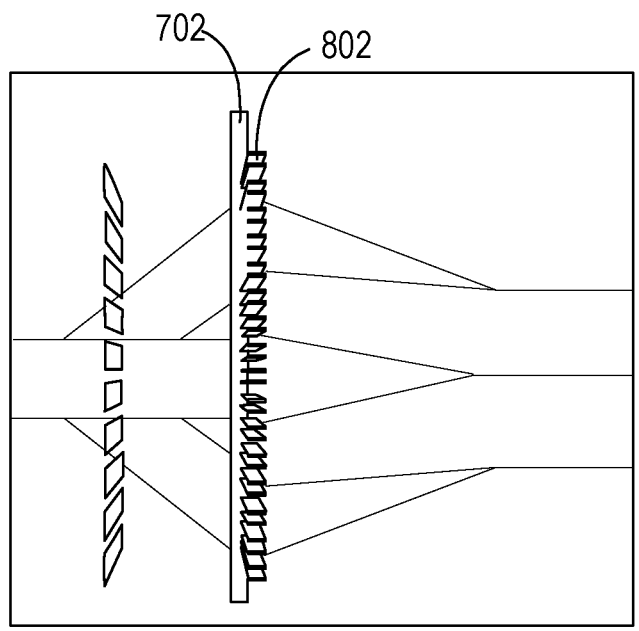
FIG. 8 illustrates a flat meta-lens created by waveguides on a glass surface according to some embodiments of the present disclosure.
Figure 9:
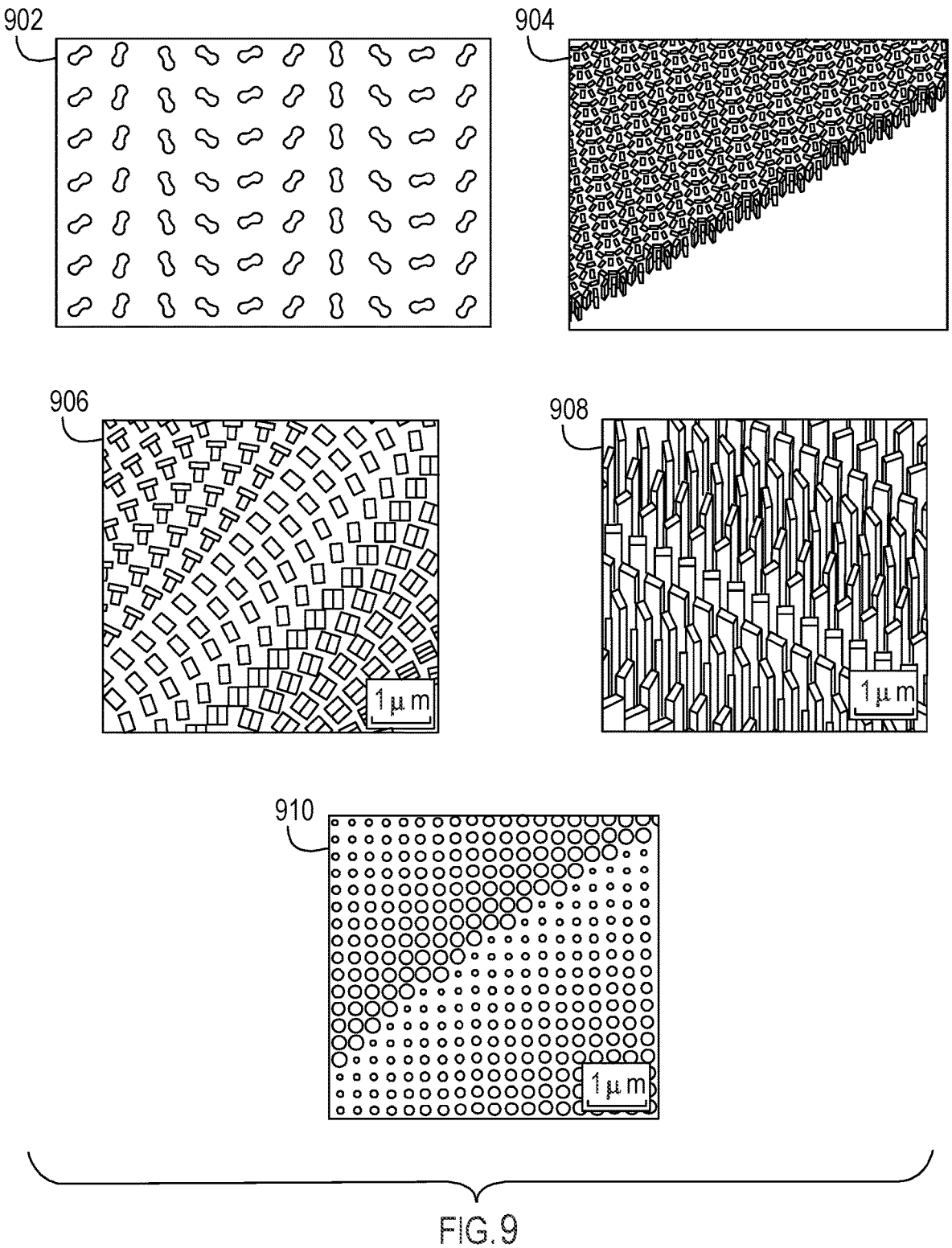
FIG. 9 illustrates various configurations of meta-lens patterning according to some embodiments of the present disclosure.

A separate type of flat optic is commonly referred to as a meta-lens. This type of lens is created by depositing a material onto the chip cover with patterns and shapes determined by the desired optical properties of the lens. One way to create a meta-lens is through metallic antennas. These metallic antennas scatter light in a way that is determined by the localized plasmon resonance of the feature. Through the feature shape, size, and metal material, the scattering can be changed in order to create an optic with a specific purpose. The meta-lens can be configured to modify the phase and or directionality of the light. Another form of meta-lens can be created by etching features, such as nanofeatures, into a dielectric layer 704 at the glass surface 702 as illustrated by the renderings of FIG. 7. In FIG. 8, a flat meta-lens is depicted where wave guides 802 are patterned on the glass surface 702. The etched features are on the wavelength scale so that transmitted light sees an effective index of refraction that is related to the ratio of dielectric material to air. Through different patterns, both of these optics can diffract light either as a focusing lens or redirect light at a determined angle. FIG. 9 provides various configurations of meta-lens patterning that may be implemented in chip cover structures of the present disclosure. For example, 902 of FIG. 9. provide metallic antenna patterns, such as a gold dipole antenna meta-lens, 906 of FIG. 9 provides metallic nanorods such as gold or the like, 908 of FIG. 9 provides metallic nanofins such as gold or the like, 910 of FIG. 9 provides pillars of a dielectric material and/or an oxide material such as titanium dioxide, and 904 of FIG. 9 provides a meta-lens of patterned pillars of a dielectric material and/or an oxide material such as titanium dioxide.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
an LED chip; and
a cover structure arranged over the LED chip, wherein the cover structure comprises an integrated secondary optic that comprises a liquid crystal optic that is arranged to alter an emission profile of light exiting the LED package.

2. The LED package of claim 1, wherein the emission profile that is altered comprises at least one of an overall emission viewing angle, an emission direction, or color uniformity over angle.

3. The LED package of claim 1, wherein the integrated secondary optic is formed on a surface of the cover structure that is in a light path of light from the LED chip.

4. The LED package of claim 1, wherein the integrated secondary optic is a flat optic layer.

5. The LED package of claim 1, wherein the liquid crystal optic comprises a polarization converter that converts light emitted by the LED chip into a single polarization.

6. The LED package of claim 5, wherein the polarization converter is between the LED chip and the liquid crystal optic.

7. The LED package of claim 5, wherein the polarization converter comprises:
a first microlens array that collimate light emitted by the LED chip and separates light into an array of discrete unpolarized light spots;

a polarization grating that splits each unpolarized light spot of the unpolarized light spots into two orthogonally polarized light spots of a first polarization and a second polarization;

a louvered multi-twist retarder that reverses a polarization of light spots of the first polarization such that each resulting light spot has a polarization of the second polarization; and a second microlens array that homogenizes the light spots of the second polarization into a single light spot of the second polarization.

8. The LED package of claim 1, wherein the cover structure comprises a superstrate and a layer of lumiphoric material.

9. The LED package of claim 8, wherein the integrated secondary optic is formed on a surface of the superstrate that is between the superstrate and the lumiphoric material.

10. The LED package of claim 8, wherein the integrated secondary optic is formed on a surface of the superstrate that is opposite the lumiphoric material.

11. The LED package of claim 1, wherein the cover structure comprises at least one of a phosphor-in-glass structure and a ceramic phosphor plate structure.

12. A light-emitting diode (LED) cover structure that covers an LED chip, comprising:

a superstrate layer; and a flat optic layer that comprises a liquid crystal optic that is arranged to alter an emission profile of light exiting an LED package comprised of the LED chip and the LED cover structure.

13. The LED cover structure of claim 12, wherein the emission profile that is altered comprises at least one of an overall emission viewing angle, an emission direction, or color uniformity over angle.

14. The LED cover structure of claim 12, wherein the liquid crystal optic comprises a polarization converter that converts light emitted by the LED chip into a single polarization.

15. The LED cover structure of claim 14, wherein the polarization converter is between the LED chip and the liquid crystal optic.

16. The LED cover structure of claim 14, wherein the polarization converter comprises:

a first microlens array that collimate light emitted by the LED chip and separates light into an array of discrete unpolarized light spots;

a polarization grating that splits each unpolarized light spot of the unpolarized light spots into two orthogonally polarized light spots of a first polarization and a second polarization;

a louvered multi-twist retarder that reverses a polarization of light spots of the first polarization such that each resulting light spot has a polarization of the second polarization; and a second microlens array that homogenizes the light spots of the second polarization into a single light spot of the second polarization.

17. The LED cover structure of claim 12, further comprising a layer of lumiphoric material, wherein the flat optic layer is formed on at least one of a surface of the superstrate that is between the superstrate and the layer of lumiphoric material or on another surface of the superstrate that is opposite the lumiphoric material.

18. The LED cover structure of claim 12, wherein the superstrate comprises an embedded lumiphoric material, wherein the flat optic layer is formed on a surface of the superstrate that is between the superstrate and a surface of the LED chip, or at another surface of the superstrate that is opposite the LED chip.

19. The LED cover structure of claim 12, wherein the flat optic layer is formed on a surface of the LED cover structure that is in a light path of light from an LED chip.

20. The LED cover structure of claim 12, further comprising at least one of a phosphor-in-glass structure and a ceramic phosphor plate structure.

* * * * *